(12) United States Patent  (10) Patent No.: US 8,778,740 B2
Williams et al.  (45) Date of Patent: Jul. 15, 2014

(54) PROCESS FOR FABRICATING MULTI-DIE SEMICONDUCTOR PACKAGE WITH ONE OR MORE EMBEDDED DIE PADS

(71) Applicants: Advanced Analogic Technologies Incorporated, Santa Clara, CA (US); Advanced Analogic Technologies (Hong Kong) Limited, Hong Kong (CN)

(72) Inventors: Richard K. Williams, Cupertino, CA (US); Keng Hung Lin, Kaohsiung (TW)

(73) Assignees: Advanced Analogic Technologies Inc., Santa Clara, CA (US); Advanced Analogic Technologies (Hong Kong) Limited, Hong Kong (CN)

( * ) Notice: Subject to any disclaimer, the term of this patent is extended or adjusted under 35 U.S.C. 154(b) by 0 days.

(21) Appl. No.: 13/897,423

(22) Filed: May 19, 2013

(65) Prior Publication Data
US 2013/0252377 A1  Sep. 26, 2013

Related U.S. Application Data

(62) Division of application No. 13/210,841, filed on Aug. 16, 2011, now Pat. No. 8,513,787.

(51) Int. Cl.
*H01L 21/44* (2006.01)
*H01L 21/48* (2006.01)

(52) U.S. Cl.
USPC ..... 438/123; 438/107; 438/617; 257/E21.509

(58) Field of Classification Search
USPC ............ 438/123, 107, 617; 257/E21.509
See application file for complete search history.

(56) References Cited

U.S. PATENT DOCUMENTS

| | | | |
|---|---|---|---|
| 6,281,568 B1 | 8/2001 | Glenn et al. | |
| 6,384,472 B1 | 5/2002 | Huang | |
| 6,841,414 B1 | 1/2005 | Hu et al. | |
| 6,847,099 B1 | 1/2005 | Bancod et al. | |
| 7,087,461 B2 * | 8/2006 | Park et al. | 438/112 |
| 7,169,651 B2 * | 1/2007 | Park et al. | 438/124 |
| 7,788,800 B2 | 9/2010 | Abbott | |
| 7,989,305 B2 | 8/2011 | Ohnuma et al. | |
| 8,551,820 B1 * | 10/2013 | Foster et al. | 438/123 |
| 2004/0130009 A1 | 7/2004 | Tangpuz et al. | |
| 2006/0199308 A1 * | 9/2006 | Lee et al. | 438/110 |
| 2010/0044850 A1 * | 2/2010 | Lin et al. | 257/690 |
| 2010/0252918 A1 | 10/2010 | Jiang et al. | |
| 2010/0258934 A1 * | 10/2010 | Chang Chien et al. | 257/690 |
| 2011/0049685 A1 | 3/2011 | Park et al. | |

* cited by examiner

*Primary Examiner* — Nitin Parekh
(74) *Attorney, Agent, or Firm* — Lando & Anastasi, LLP

(57) ABSTRACT

To avoid shorts between adjacent die pads in mounting a multi-die semiconductor package to a printed circuit board (PCB), one of the die pads is embedded in the polymer capsule, while the other die pad is exposed at the bottom of the package to provide a thermal escape path to the PCB. This arrangement is particularly useful when one of the dice in a multi-die package generates more heat than another die in the package. A process for fabricating the package includes a partial etch that defines the bottom surface of the embedded die pad and may include a through-etch that leaves one or more of the contacts or leads integrally connected to the embedded die pad.

15 Claims, 11 Drawing Sheets

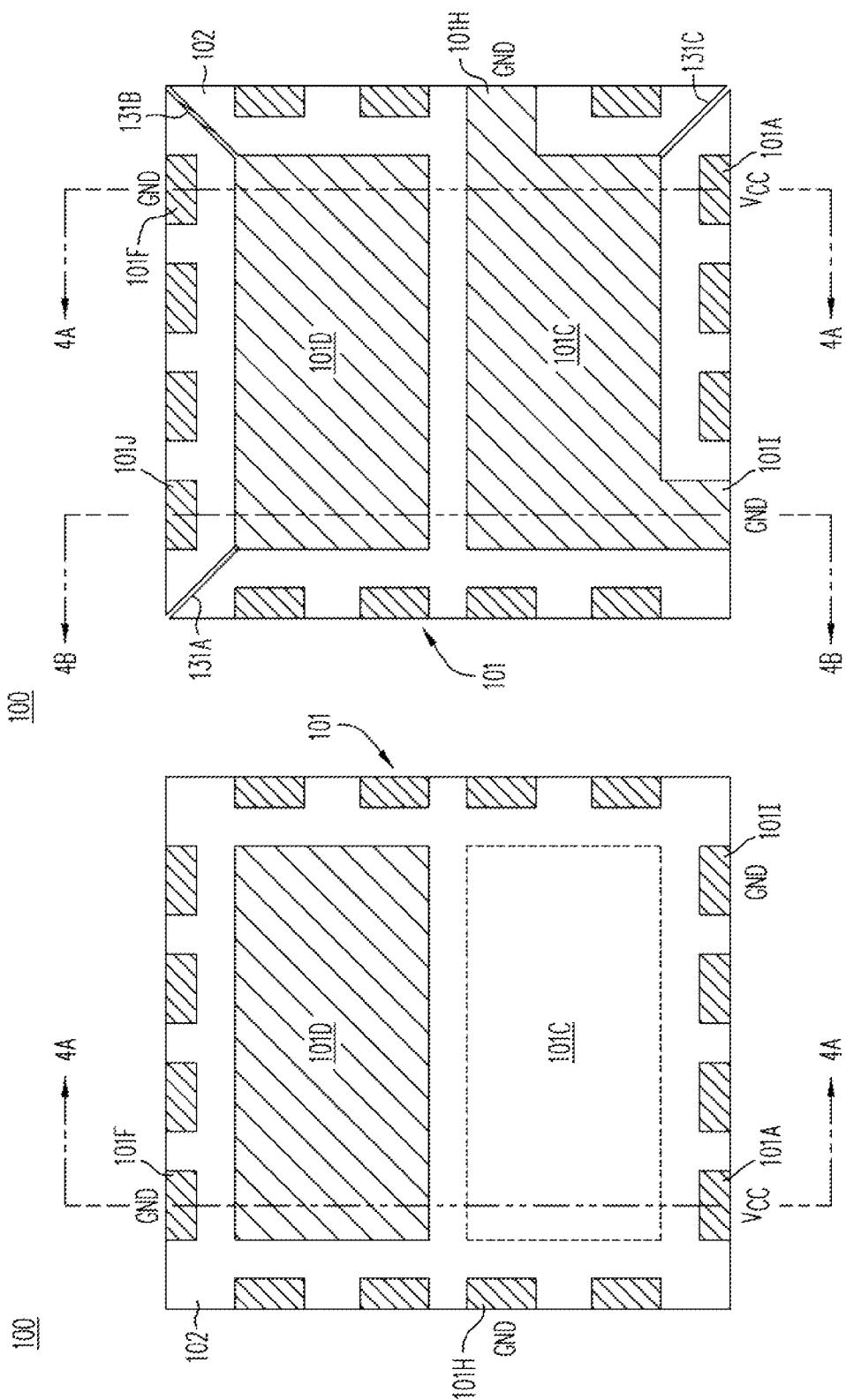

PROCESS FOR FABRICATING MULTI-DIE SEMICONDUCTOR PACKAGE WITH ONE OR MORE EMBEDDED DIE PADS

CROSS-REFERENCE TO RELATED APPLICATION

This application is a divisional of application Ser. No. 13/210,841, filed Aug. 16, 2011 which is incorporated herein by reference in its entirety.

BACKGROUND OF THE INVENTION

This application relates to semiconductor die packages that contain multiple semiconductor dice.

In semiconductor packages, a semiconductor die is sometimes mounted on a highly heat-conductive (typically metal) die pad that is exposed at the bottom of the package. Particularly when the die contains a device that generates significant amounts of heat—for example, a power MOSFET or other semiconductor power device—the die pad (or metal slug) serves as a thermal conductive path that allows heat generated in the die to flow to the structure on which the package is mounted, typically a printed circuit board (PCB). This helps to prevent the die from overheating, which can damage or destroy the die.

In some cases two or more dice are housed in a single package. For example, a single package may contain a power MOSFET die together with a control die that contains circuitry for turning the power MOSFET off and on. This type of circuit is represented schematically by control die 2 and power MOSFET die 3 shown in FIG. 1. Power MOSFET die 3 contains a power MOSFET 6 whose source and body terminals are shorted together and connected to ground and whose drain terminal is connected to a load 8. The source-body short in MOSFET 6 creates an intrinsic diode 7 that is in parallel with the source-body and drain terminals of MOSFET 6.

MOSFET 6 is controlled by control die 2, which contains a control element 4 and a buffer 5, an output terminal of buffer 5 being connected to the gate terminal of MOSFET 6. As shown, control die 2 is connected between a positive supply voltage $V_{CC}$ and ground.

FIG. 2A illustrates a cross-sectional view of buffer 5 in control die 2, which includes a P substrate 2. Buffer 5 includes an N-channel MOSFET 26A and a P-channel MOSFET 26B, MOSFET 26A being formed in a P-well 23 and MOSFET 26B being formed in an N-well 22, which serve as the body regions of the respective MOSFETs. In MOSFET 26A, an N+ source region 25C and a P+ body contact region 24A are shorted together and connected to ground. In MOSFET 26B, a P+ source region 24C and an N+ body contact region 25A are shorted together and connected to $V_{CC}$. An N+ drain region 25B of MOSFET 26A and a P+ drain region 24B of MOSFET 26B are connected together and provide an output voltage $V_{OUT}$ that is delivered to the gate terminal of power MOSFET 6. An input voltage $V_{IN}$ from control element 4 is delivered to the respective gate terminals of MOSFETs 26A and 26B. Thus when $V_{IN}$ is high, MOSFET 26A is turned on and MOSFET 26B is turned off and $V_{OUT}$ is approximately equal to ground and when $V_{IN}$ is low, MOSFET 26A is turned off and MOSFET 26B is turned on and $V_{OUT}$ is approximately equal to $V_{CC}$.

FIG. 2B illustrates a cross-sectional view of MOSFET 6 in die 3, which includes an N+ substrate 31. An N-epitaxial layer 32 is grown on N+ substrate 31. N+ source regions 35, P-body regions 33 and P+ body contact regions 34 are implanted into N-epitaxial layer 32, and trenches 38 are etched from the surface of die 3 through N+ source regions 35 and P-body regions 33. Each of trenches 38 contains a gate terminal 37 and a gate oxide layer 36, which insulates gate terminal 37 from N-epitaxial layer 32. A metal layer 39 overlies the surface of N-epitaxial layer 32 and shorts together N+ source regions 35, P-body regions 33 and P+ body contact regions 34. The N+ substrate 31 represents the drain terminal of MOSFET 6. Consistent with FIG. 1, metal layer 39 (the source-body terminal) is connected to ground and N+ substrate 31 (the drain terminal) is connected to the load 8.

The gate electrodes 37 are accessed in the third dimension, outside the plane of FIG. 2B, and this connection is shown schematically.

Thus power MOSFET 6 is an N-channel MOSFET. $V_{OUT}$ from buffer 5 is connected to gate electrodes 37. When $V_{OUT}$ is high ($V_{CC}$), MOSFET 6 is turned on; when $V_{OUT}$ is low (ground), the gate-to-source voltage of MOSFET 6 is equal to zero and MOSFET 6 is turned off.

A key aspect of dice 2 and 3 is that in this arrangement the P substrate 21 of die 2 is connected to ground and the N+ substrate 31 of die 3 is connected to the load 8. As shown in FIG. 1, since the source-body terminal of MOSFET 6 is grounded, the N+ substrate 31 (drain) in on the high side of MOSFET 6. As a result, when MOSFET 6 is turned off the voltage at N+ substrate 31 approaches the high voltage (+HV) that drives the load 8.

FIG. 3A shows a cross-sectional view of a conventional semiconductor package 50 containing dice 2 and 3. Die 2 is mounted on a die pad 51B and die 3 is mounted on a die pad 51C. Dice 2 and 3 and die pads 51B and 51C are encased in a capsule 53 made of a molding compound, typically a plastic material. Since power MOSFET 6 generates a significant amount of heat, die pad 51C is exposed at a bottom surface 53B of capsule 53 thereby providing a thermal conduction path for the heat generated in die 3 to escape to the PCB or other structure (not shown) on which package 50 is mounted. Likewise, (lie pad 51B is exposed at the bottom surface 53B of capsule 53. Apart from their thermal functions, die pads 51B and 51C also provide electrical contact to terminals on the bottom surfaces of dice 2 and 3.

The top surface of die 2 is connected via a bonding wire 52A to a contact 51A, and the top surface of die 3 is connected via a bonding wire 52B to a contact 51D. Since package 50 is a "no-lead" type of package, the outside surfaces of contacts 51A and 51D are flush with the bottom surface 53B and side surfaces 53S of capsule 53. Consistent with FIG. 1, bonding wire 52A connects to the source-body terminal of MOSFET 26B, and thus contact 51A is connected to $V_{CC}$. (Another bonding wire and contact (not shown) connect the source-body terminal of MOSFET 26A to ground.) Bonding wire 52B connects to the source-body terminal of MOSFET 6, and thus contact 51D is connected to ground.

P substrate 21 of die 2 is connected via die pad 51B to ground, and N+ substrate 31 of die 3 is connected via die pad 51C to a voltage that can approach the high voltage +HV. As noted above, both die pad SIB and die pad 51C are exposed at the bottom of package 50.

FIG. 3B is a bottom view of package 50. The exposed bottom surfaces of die pads 51B and 51C as well as the cross-section 3A-3A of FIG. 3A are shown.

Having exposed die pads that may assume different voltages in operation can create problems. When the package is mounted onto a PCB or other supporting structure, bits or pieces of metal or other conductive materials may become trapped between the package and the PCB and may create a short between the die pads. These latent shorts may remain undetected, visually hidden beneath the plastic package. While X-rays may be used to identify the shorts, X-ray inspection is expensive and potentially hazardous to workers.

BRIEF SUMMARY OF THE INVENTION

In a multi-die package according to this invention, at least one of the die pads remains embedded in the capsule such that its bottom surface is not exposed. Typically, this will be the die pad that is attached to the die that generates less heat. In the above example, the die pad attached to the control die would be left embedded in the capsule. This invention is not limited in this way, however. In a multi-die package, any one or more of the die pads may be left embedded in the capsule to prevent a possible short with an exposed die pad.

Leaving a die pad embedded in the capsule eliminates the risk of shorts between the embedded die pad and other die pads in the package when the package is mounted onto a PCB or other supporting structure.

To provide electrical contact with a terminal on the bottom of the die that is mounted on the embedded die pad, one or more of the contacts or leads in the package may be formed as an integral part of the embedded die pad.

The invention includes a process for fabricating a multi-die package as described above. The process includes a partial etch that defines the bottom surface of the embedded die pad and may include a through-etch that leaves one or more of the contacts or leads integrally connected to the embedded die pad.

BRIEF DESCRIPTION OF THE SEVERAL VIEWS OF THE DRAWING

FIGS. 5A and 5B are bottom and top views, respectively, of the semiconductor package shown in FIGS. 4A and 4B.

DETAILED DESCRIPTION OF THE INVENTION

Figure 4A:
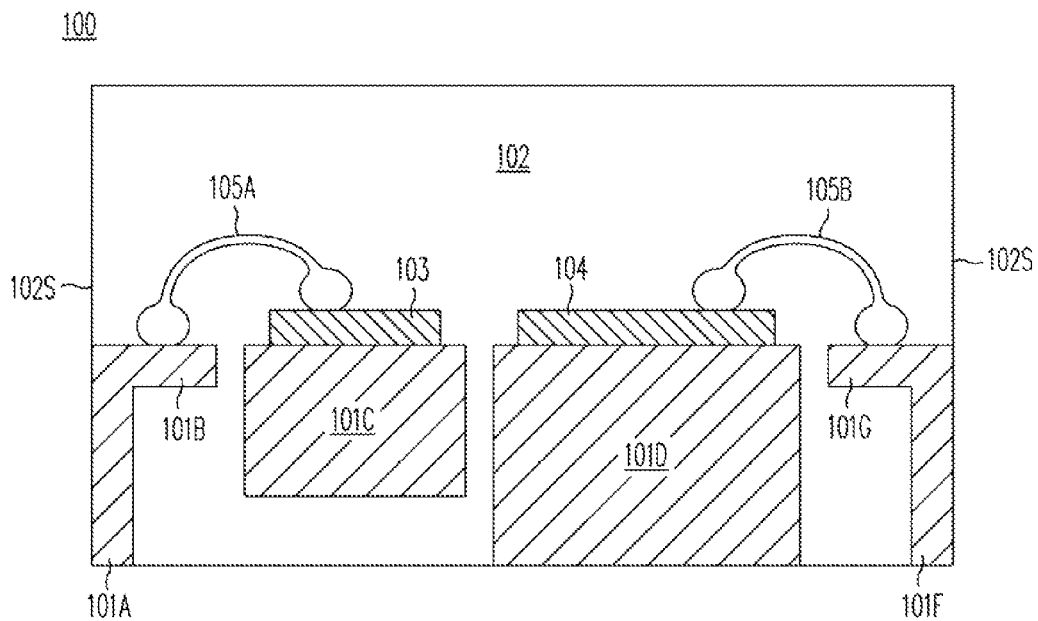
FIGS. 4A and 4B are cross-sectional view of a no-lead multi-die semiconductor package in accordance with the invention.

FIG. 4 is a cross-sectional view of a semiconductor package 100 in accordance with the invention. A control die 103 is mounted on a die pad 101C. A power MOSFET die 104 is mounted on a die pad 101D. In this embodiment, control die 102 is similar to control die 2 and power MOSFET die 104 is similar to power MOSFET die 3.

Circuitry on the top surface of die 103 is connected via a bonding wire 105A to a contact 101A, which includes a horizontal cantilever extension 101B. Circuitry on the top surface of die 104 is connected via a bonding wire 105B to a contact 101F, which includes a horizontal cantilever extension 101G. All of the foregoing components are encased in a capsule 102, consisting of a polymer material, which has side edges 102S and a bottom surface 102B.

Package 100 is a "no-lead" package. Accordingly contacts 101A and 101F do not protrude from capsule 102; instead, the side edges of contacts 101A and 101F are flush (coplanar) with the side edges 102S of capsule 102 and the bottom surfaces of contacts 101A and 101F are flush with the bottom surface 102B of capsule 102.

The bottom of die pad 101D is exposed at the bottom surface 102B of capsule 102, whereas die pad 101C is embedded in capsule 102. Therefore, there is no risk of forming a short between die pad 101C and die pad 101D when package 100 is mounted onto a PCB (not shown).

FIG. 5A is a bottom view and FIG. 5 is a top view of package 100, each drawing showing the cross-section 4-4 at which FIG. 4 is taken. As is evident from FIGS. 5A and 5B, contacts 101A and 101F are but two contacts of 16 contacts 101 that line the periphery of package 100, with four contacts on each side of package 100. In FIG. 5A die pad 101C is shown in dashed lines to indicate that die pad 101C is not actually visible in this bottom view. FIG. 5B shows tie bars 131A and 131B that connect die pad 101D to the leadframe during the fabrication of package 100. Similarly, a tie bar 131C connects die pad 101C to the leadframe. As explained below, tie bars 131A-131C are severed in the normal way when package 100 is singulated from the other semiconductor packages that are fabricated from the leadframe.

Figure 1:
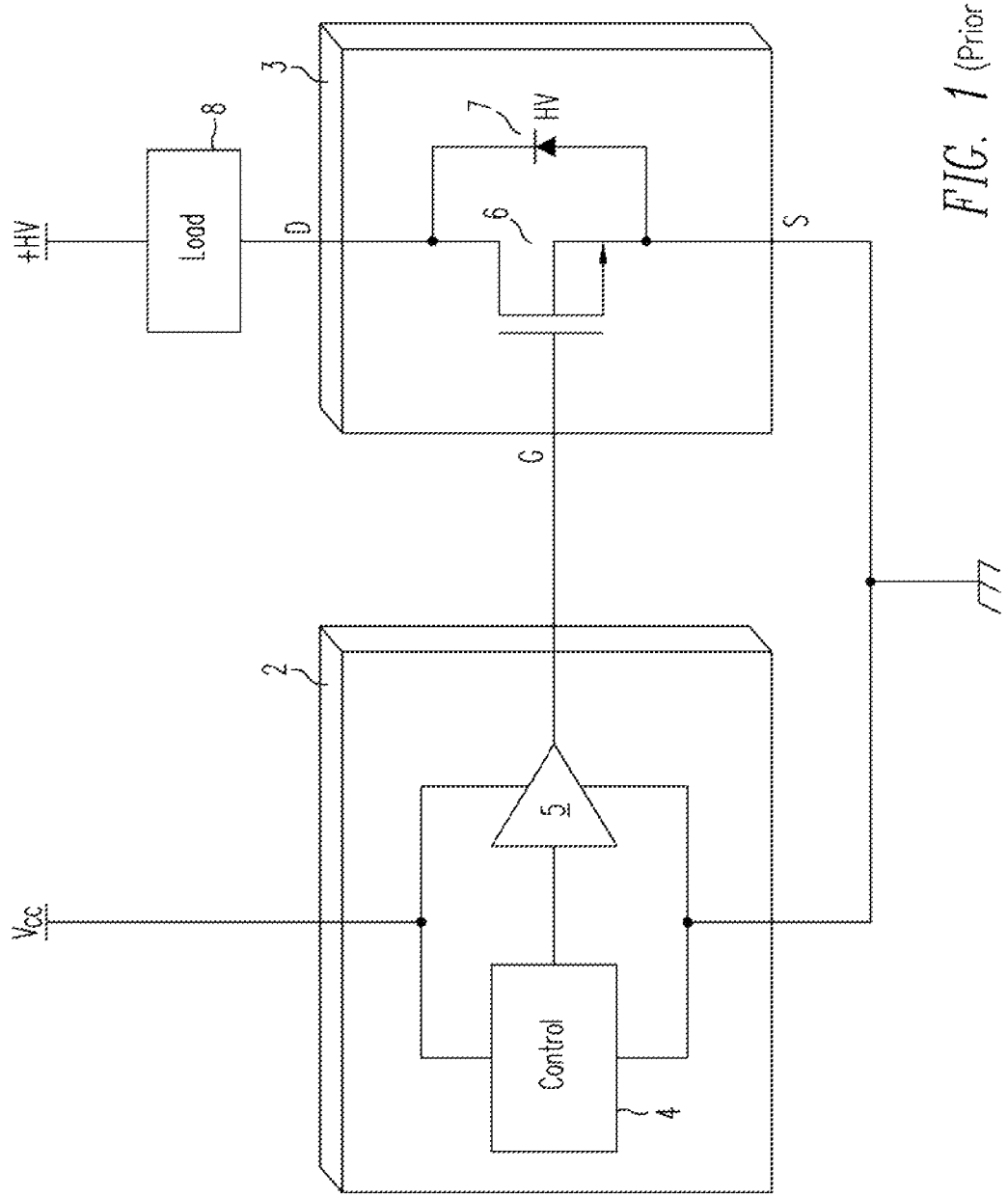
FIG. 1 is a circuit diagram of a conventional circuit that includes a power MOSFET, a load that is switched by the power MOSFET, and control circuitry for the power MOSFET.
Figure 2A:
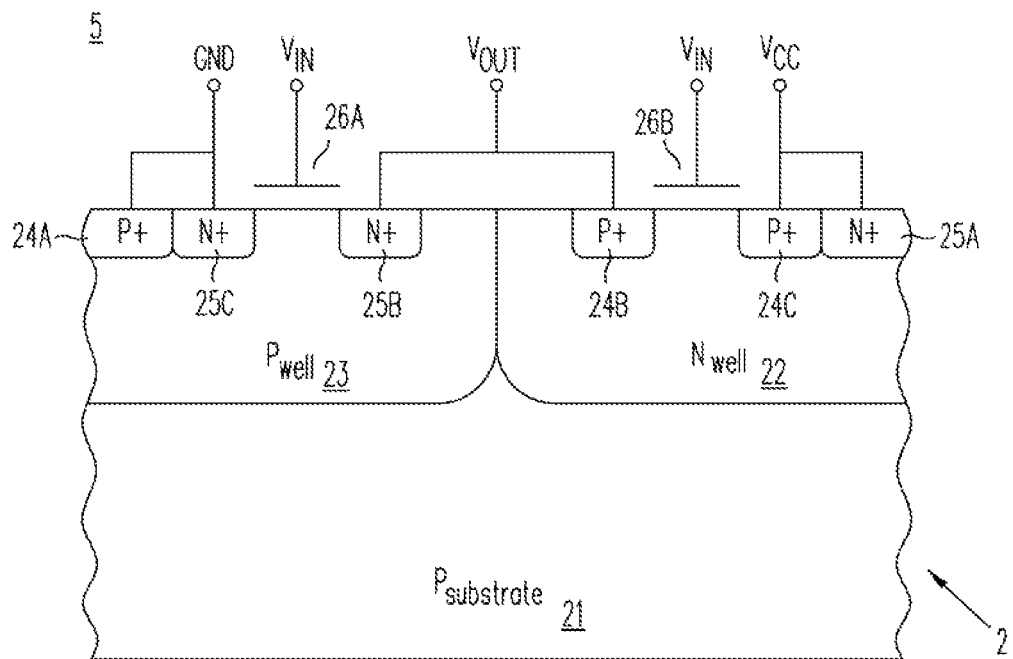
FIG. 2A is a cross-sectional view of a portion of the control circuitry for the power MOSFET.
Figure 2B:
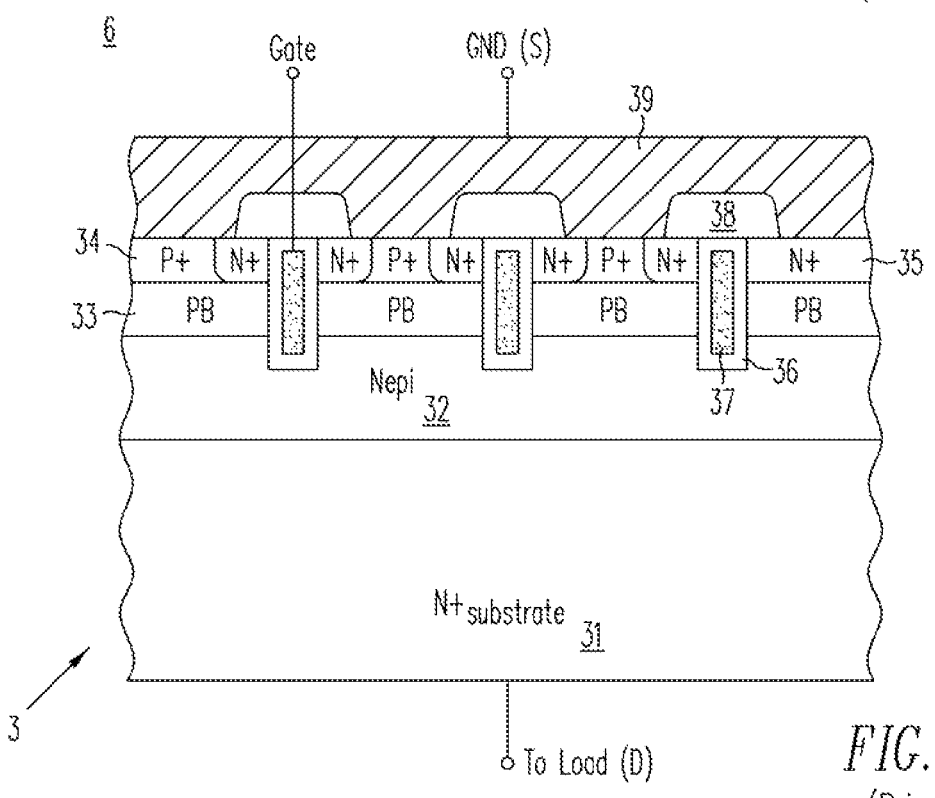
FIG. 2B is a cross-sectional view of the power MOSFET.
Figure 4B:
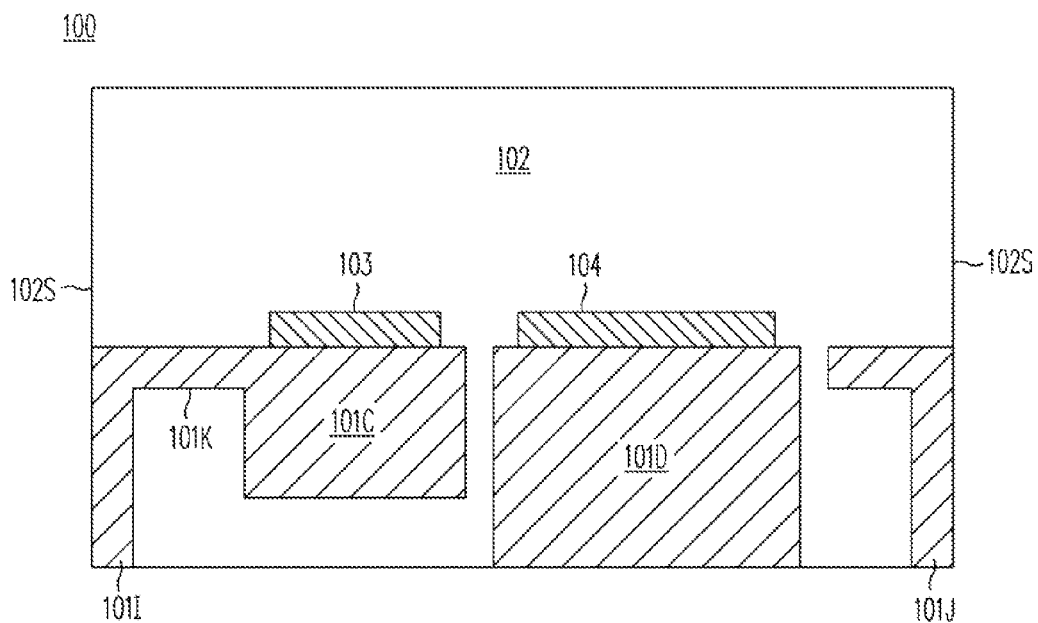

As shown in the top view of FIG. 5B, contacts 101H and 101I are directly connected to die pad 101C and in fact are formed as integral parts of die pad 101C. The structure of contact 101I is shown in FIG. 4B, which is cross-sectional view of package 100 taken at cross-section 4B-4B in FIG. 5B. As shown in FIG. 4B, contact 101I includes a horizontal cantilever extension 101K that joins die pad 101C. Thus contact 101I is in reality an integral extension of the die pad 101C. This allows electrical contact to be made to the bottom side of die 103 through contact 101I. Consistent with FIGS. 1 and 2A, contact 101I is shown as being connected to ground.

Figure 3A:
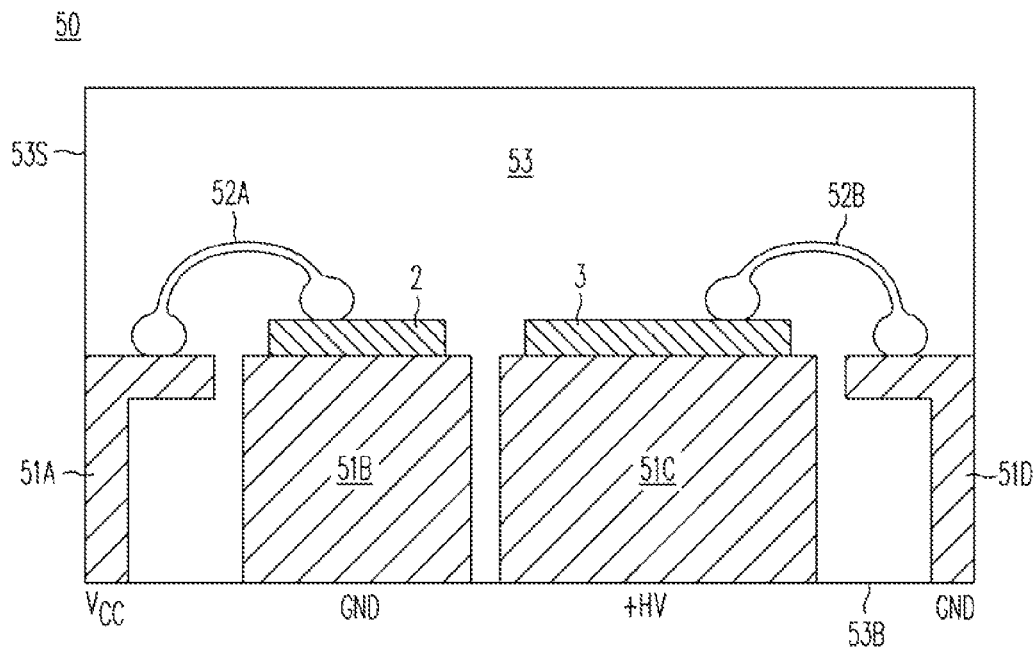
FIGS. 3A and 3B are cross-sectional and bottom views, respectively, of a conventional multi-die package.
Figure 3B:
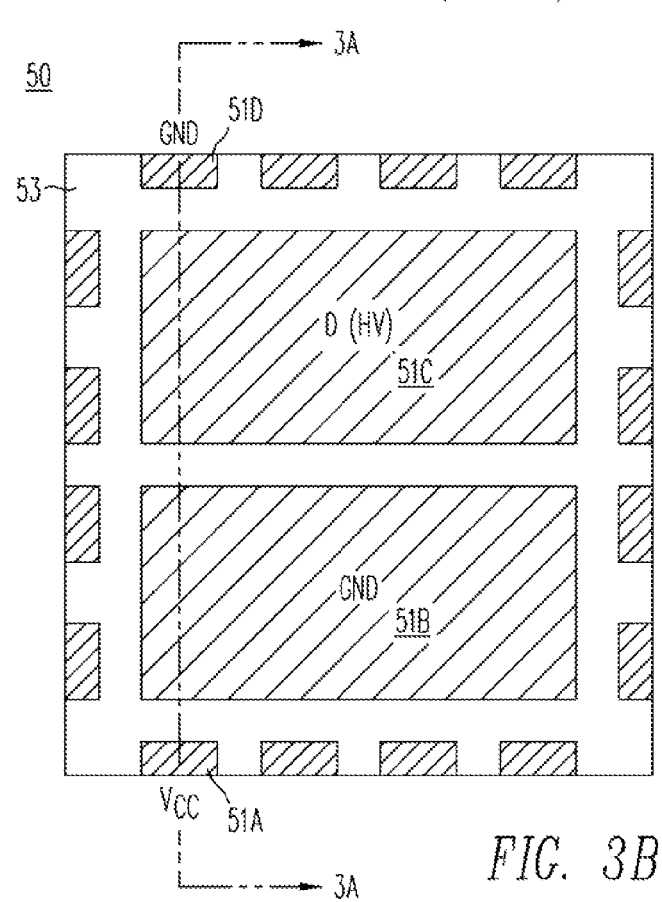

Since the exposed surfaces of contacts 101I and 101H at the bottom of capsule 102 are more distant from the exposed surface of die pad 101D than die pad 101C would be if its bottom surface were exposed, the risks of an electrical short being created between die pads 101C and 101D when package 100 is mounted on a PCB are far less than they are in a package of the type shown in FIG. 3A.

Figure 6:
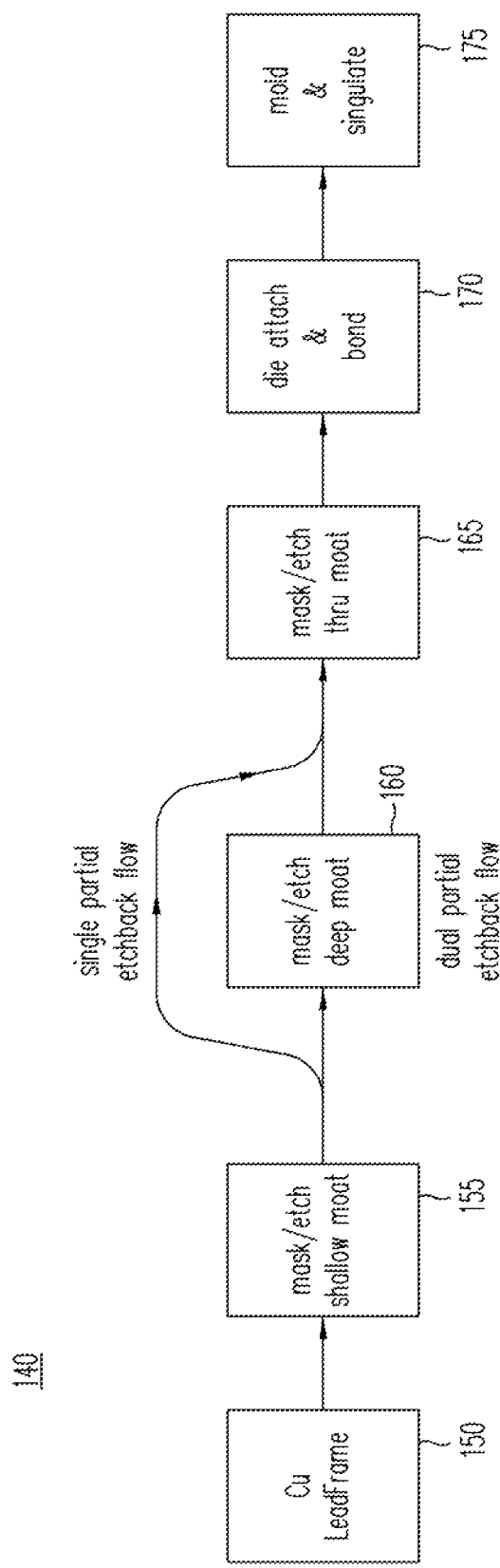
FIG. 6 is a flowchart of a process for fabricating the semiconductor package.

FIG. 6 is a flowchart of a possible process for fabricating a semiconductor package of this invention.

The process begins with a conventional copper leadframe (box 150). The leadframe is masked where the exposed die pads and the exposed bottom surfaces of the contacts will be located and is then partially etched for example, using ammonium persulfate, sodium persulfate, ferric chloride, or other etchants comprising hydrochloric acid, nitric acid or sulfuric acid to define the bottom surface of the embedded die pads. This is referred to as the "shallow moat" (box 155). The leadframe is masked again to cover the bottom surfaces of the contacts and the exposed and embedded die pads, and a second, "deep moat" partial etch is performed to define the lower surfaces of the horizontal cantilever extensions of the contacts (box 160). The exposed die pad can also referred to as the heat slug, and the embedded die pad can also be referred to as a non-exposed die pad.

The shallow moat etch may also be used to define the lower surfaces of the horizontal cantilever extensions of the contacts as well as the bottom surfaces of the embedded die pads, in which case the "deep moat" etch is omitted. The leadframe is masked again to cover the bottoms of the exposed and embedded die pads and the exposed bottom surfaces and undersides of the cantilever extensions of the contacts, and a through-etch is performed to separate the die pads and contacts from each other (box 165). The dice are then attached to the die pads and wire-bonded to the contacts (box 170). The entire leadframe at this point typically consists of a rectangular array of die pads and contacts that will form numerous packages when completed. The leadframe is then encased in a polymer molding compound, typically using an injection-molding process, and the individual packages are singulated by sawing or punching the polymer-coated leadframe along perpendicular lines (box 175).

One version of the process is shown in greater detail in the cross-sectional views of FIGS. 7A-7F.

Figure 7A:
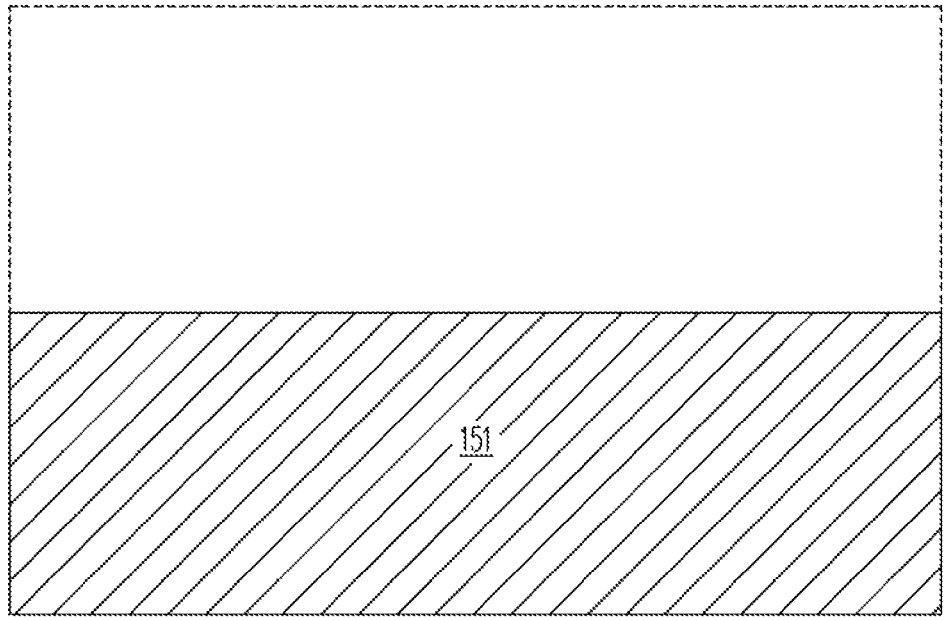
FIGS. 7A-7F illustrate several steps in a three-mask fabrication process.
Figure 7B:
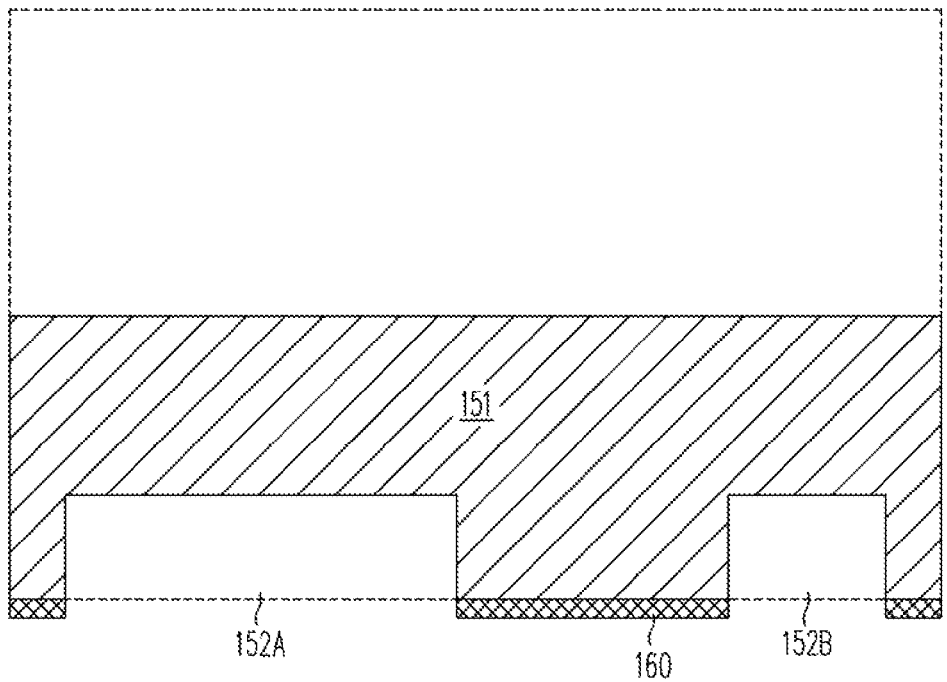

FIG. 7A shows a copper sheet 151, typically 0.2 to 0.4 mm thick, from which the leadframe will be fabricated. A first mask layer 160, typically organic photoresist, is deposited on a surface of copper sheet 151 and then photolithographically patterned to leave mask layer in place where the exposed die pads and the bottom surfaces of the contacts are to be located. Alternatively, the masking material may be silkscreened to define the pattern. Copper sheet 151 is then partially etched to form a "first moat" including trenches 152A and 152B, etching away between 10% to 60% of the copper's thickness and preferably around 30%. The first mask layer material 160 may be removed or alternatively left in place to mask subsequent etching steps. The resulting structure is shown in FIG. 7B where regions 152A and 152B have a thickness equal to 40% to 90% of the starting thickness of copper sheet 151.

Figure 7C:
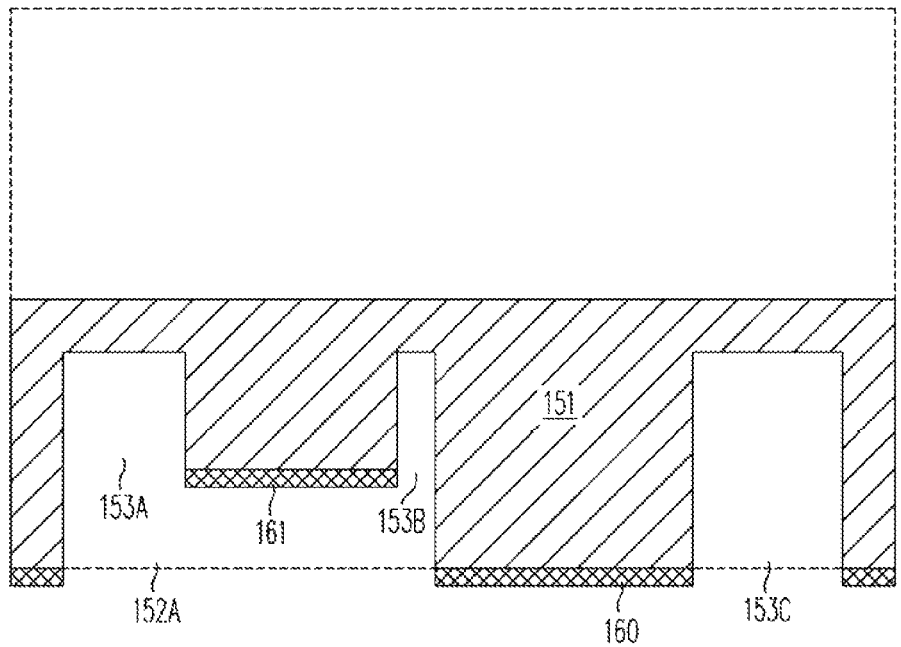

A second mask layer 161 is deposited and photolithographically patterned to leave mask layer 161 in place where the embedded die pads are to be located. Copper sheet 151 is then partially etched again to form a "second moat" including trenches 153A, 153B and 153C. The resulting thickness of the copper regions etched twice 153A, 153B, and 153C is thinner than the regions etched once, having a final thickness of 10% to 60% of the original thickness of copper sheet 151. The result is shown in FIG. 7C. Region 152A remains unaffected by this operation, retaining the same thickness as shown in FIG. 7B. Other portions, not etched during the first or the second etch, remain at the original thickness of copper sheet 151.

In a preferred embodiment, the twice-etched regions 153A, 153B and 153C, are contained entirely within first etched regions 152A and 152B, so that only regions of copper sheet 151 that are already thinned during the first etch receive the second etching step. Mask layer 161 covers and protects the isolated die pad portion (e.g. die pad 101C in FIG. 44). In the event that masking material 160 is removed after the first etching step, mask layer 161 must also cover the portions of copper sheet 151 originally protected by mask layer 160.

A third mask layer 163 is deposited and photolithographically patterned to leave mask layer 163 in place during a third copper etch, designed to selectively separate the contacts from the heat slug and from the non-exposed die pad. After the third mask layer 163 is applied, copper sheet 151 is then etched completely through to separate embedded die pad 101C from exposed die pad 101D and from contacts 101A and 101F. Specifically, the third etch completely removes the copper from the unprotected portions of previously etched regions 153A, 153B and 153C, to form the fully etched regions 154A, 154B and 154C as shown in FIG. 79. Mask 163 results in a horizontal cantilever extension 101B of lead 101A and a horizontal cantilever extension 101G of lead 101F.

In a preferred embodiment, second etched regions 154A, 154B and 154C, are contained entirely within the twice-etched regions 153A, 153B and 153C, so that only regions of copper sheet 151 thinned during the first and second copper etch receive the third etching step. Mask layer 163 covers and protects the horizontal cantilever extensions 101B and 101G.

In the event that mask layer 160 is removed after the first etch step and mask layer 161 is removed after the second etch step, mask layer 163 mist also cover the portions of copper sheet 151 originally protected by mask layers 160 and 161. Alternatively, provided the thickness; of cantilever sections 101B and 101G are a small fraction of embedded die pad 101C, then the bottom side of copper elements 101A, 101C, 101D and 101F may be allowed to erode during, the third etch. The final package thickness in such an instance will be thinner than if the same regions are protected during the third etch.

If one or more of the contacts are to be formed as integral extensions of the embedded die pad 101C, as shown by contact 101I in FIG. 4B, then it will be understood that the third mask layer 163 will also be patterned to remain over horizontal cantilever extension 101K. As a result the contact 101I will remain as an integral extension of die pad 101C after the final through-etch.

Figure 7D:
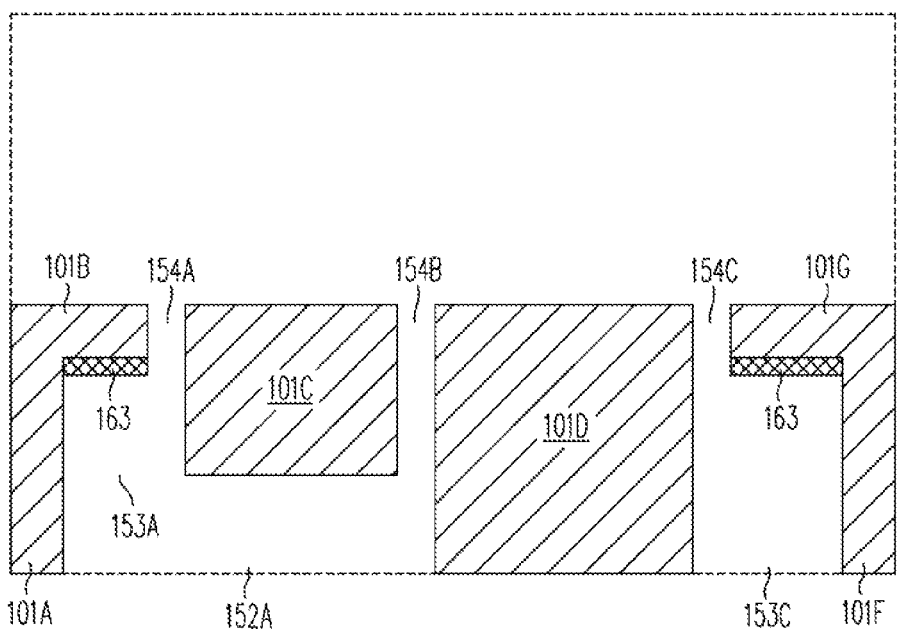
Figure 7E:
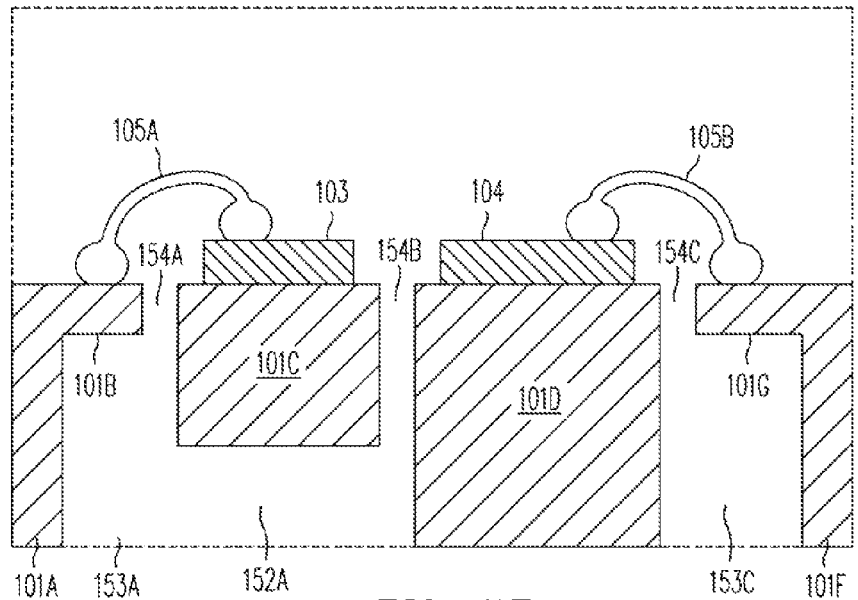
Figure 7F:
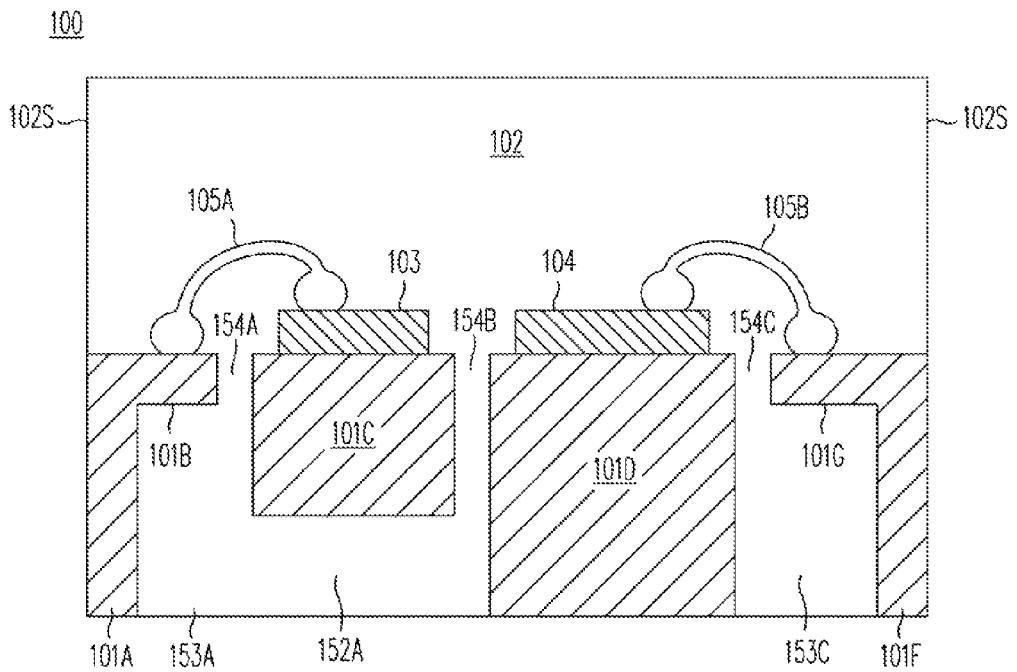

It will also be understood that although die pads 101C and 101D appear in FIG. 7D as being completely separated from contacts 101A and 101F, die pads 101C and 101D remain connected to the lead frame by tie bars 131A-131C, shown in FIG. 5B, that are outside the plane of FIG. 7D.

Next, mask layers 161-163 are removed, and control die 103 is attached to embedded die pad 101C and power MOSFET die 104 is attached to exposed die pad 101D. Wire bonds 105A and 105B are created, leaving the structure shown in FIG. 7E.

Using an injection molding process, all of the elements of the package are then encased in a polymer molding compound, with the bottom surfaces of the exposed die pad 101D and the contacts 101A and 101F remaining exposed after the molding process is completed. The result is a polymer sheet containing many packages positioned in a rectangular array. To complete the fabrication process, the polymer sheet is sawn along perpendicular lines to separate the packages from each other, a process often referred to as "singulation." The result is package 100, shown in FIG. 7F. The saw cuts would be made at the side edges 102S of the package, cutting through contact metal regions 101A and 101F on adjacent packages, and it will be understood that there are packages identical to package 100 on the left and right side of package 100.

Figure 8:
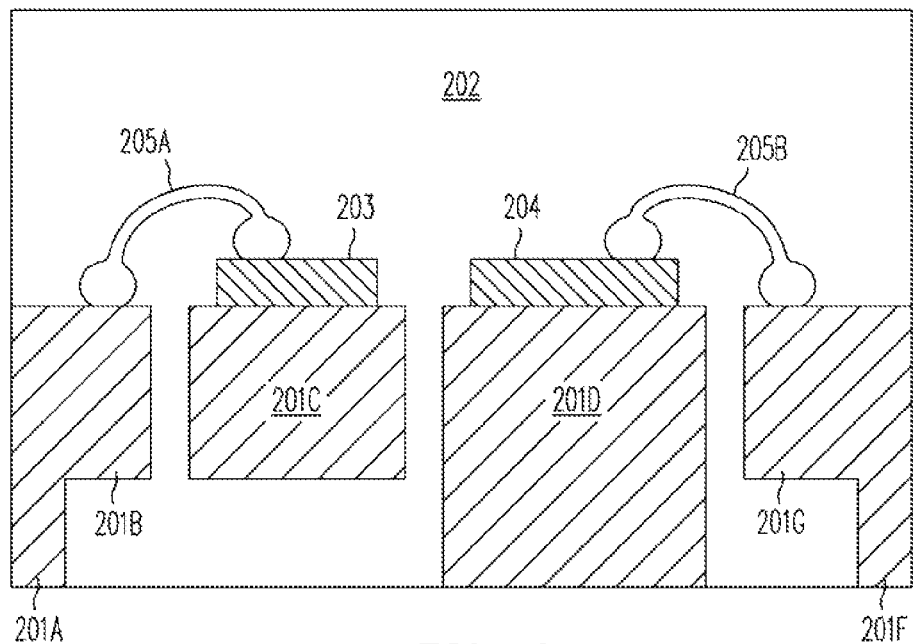
FIGS. 8 and 9 illustrate embodiments fabricated by an alternative two-mask process.

In an alternative version of the process, the second and third mask layers are combined into a single second mask layer, and there is only one partial etch, which defines the bottom surfaces of both the embedded die pad and the horizontal cantilever extension of the contacts. The resulting package is exemplified by package 200, shown in FIG. 8, wherein the bottom surfaces of the horizontal cantilever extensions 201B and 210G of the contacts 201A and 201F, respectively, are coplanar with the bottom surface of the embedded die 201C. Also shown in FIG. 8 are an exposed die 201D, dice 203 and 204, bonding wires 205A and 205B, and a polymer capsule 202.

In package 200, the embedded die pad 201C is of approximately the same as the embedded die pad 101C in package 100. As a result the horizontal cantilever extensions 201B and 201G in package 200 are thicker than the horizontal cantilever extensions 101B and 101G in package 100. Etching through thicker layers, however, generally requires a larger space between the various copper elements, thereby reducing the useable area for silicon devices within the same package footprint.

Figure 9:
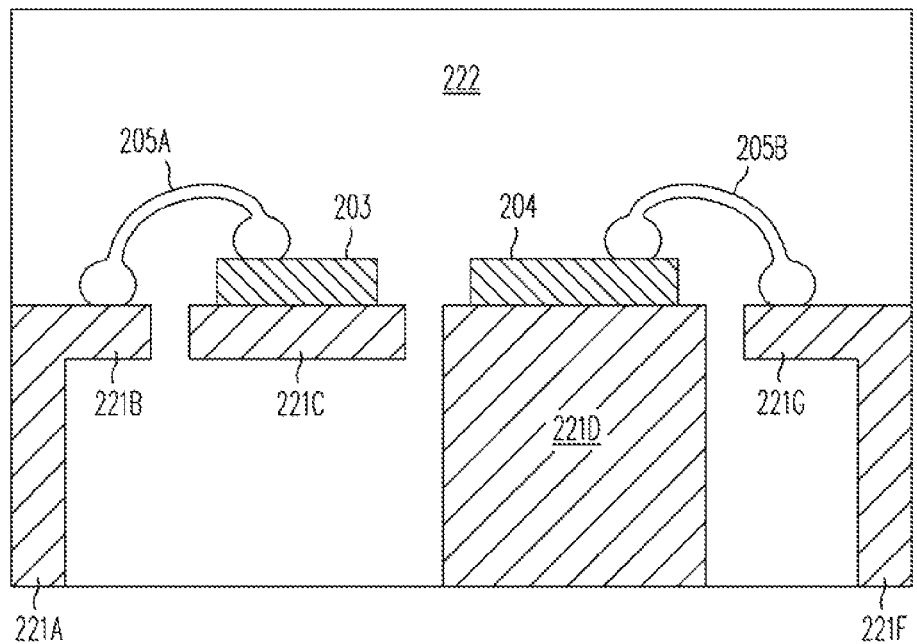

Alternatively, using the simplified two-mask process the horizontal cantilever extension can have the same thickness as horizontal cantilever extensions 101B and 101G in package 100. The result is package 220, shown in FIG. 9, wherein horizontal cantilever extensions 221B and 221G of contacts 221A and 221G, respectively, are of the same thickness as horizontal cantilever extensions 101B and 101G in package 100. As a result, embedded die pad 221C in package 220 is thinner than embedded die pad 101C in package 100. A thinner embedded die pad 101C exposes the silicon die to more stress and deformation during handling, and the assembly process, increasing the chances of die cracking, plastic delamination, and plastic cracking. Also shown in FIG. 9 are an exposed die 221D, dice 203 and 204, bonding wires 205A and 205B, and a polymer capsule 222.

Figure 10:
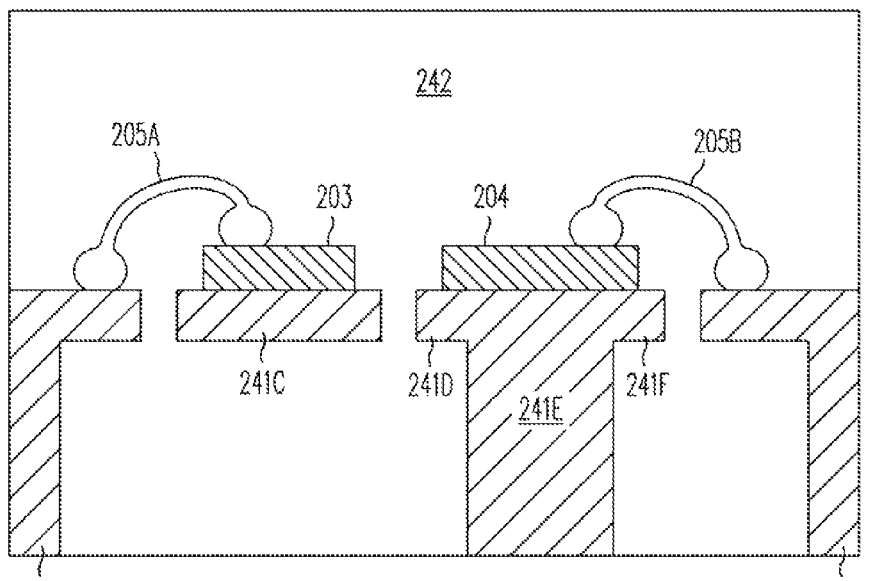
FIG. 10 illustrates an embodiment wherein a peripheral shelf is formed around the exposed die pad.

In another alternative, the third mask layer (in the three-mask process shown in FIGS. 7A-7F) or the second mask layer (in the two-mask process) can be used to define a peripheral shelf around the exposed die. The result (using the two-mask process) is package 240, shown in FIG. 10, wherein the exposed die 241E has a peripheral shelf 241D, 241F, which helps to anchor exposed die 241E in the capsule 242. Also shown in FIG. 10 are an embedded die 241C, dice 203 and 204, bonding wires 205A and 205B, contacts 241A and 241G, and a polymer capsule 242.

Figure 11:
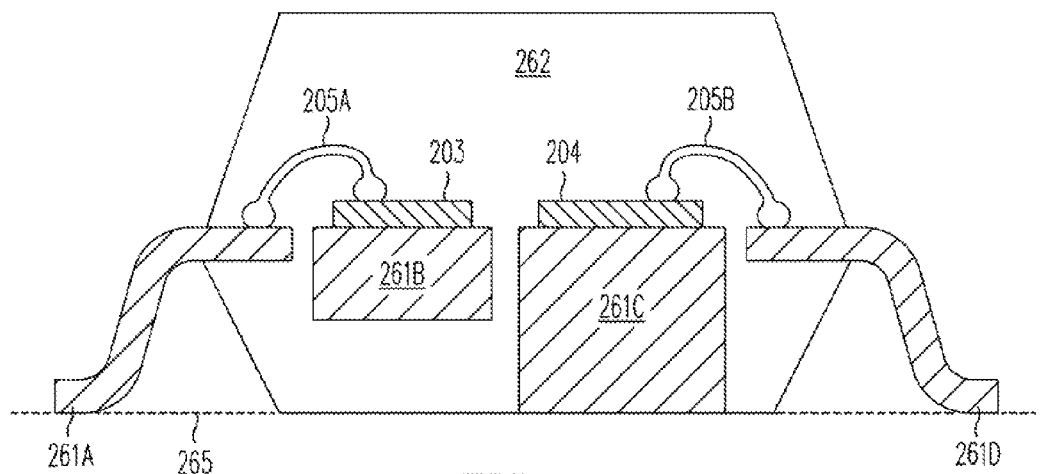
FIG. 11 illustrates the application of the invention to a "gull-winged" multi-die package such as a small-outline transistor (SOT) package or any various small outline packages (SOP, SSOP, TSOP, TSSOP, etc.).

The embodiments of this invention described above are so-called "no lead" semiconductor packages such as the DFN or QFN, an acronym for dual or quad sided flat no-lead packages, wherein the contacts do not protrude from the polymer capsule. This invention, however, is also applicable to other types of packages. FIG. 11, for example, shows a traditional "gull wing" package 260 wherein the leads 261A and 261D protrude laterally from a capsule 262 and are bent downward towards a mounting surface 265, shown by the dashed line. Such packages include the small-outline transistor (SOT) package, the SC70 package, or any various leaded surface mount packages including the small outline package (SOP), super small outline package (SSOP), the thin small outline package (TSOP), and the thin super small outline package (TSSOP). The method is also applicable to non-surface mount leaded packages like the dual in-line package (DIP), or the single in-line package (SIP).

The process of fabricating the embedded die pad 261B, exposed die pad 261C and leads 261A and 261D is similar to that described above for the "no-lead" package 100, except that the final etch leaves leads 261A and 261D extending laterally outward from die pads 261B and 261C, and leads 261A and 261D and then bent downward so that they mate with mounting surface 265. Another difference in the fabrication process is that capsule 262 is formed initially as a separate capsule; the singulation process described above does not occur.

The embodiments of this invention described above are to be viewed as illustrative and not limiting. Numerous alternative embodiments within the broad scope of this invention will be apparent to persons of skill in the art.

We claim:

1. A method of fabricating a leadframe for a semiconductor package comprising;
   forming a first mask layer on a surface of the leadframe where a first die pad is to be located;
   performing a first partial etch of the leadframe around the first mask layer to define a level of a bottom surface of a second die pad;
   forming a second mask layer where the bottom surface of the second die pad is to be located;
   performing a second partial etch of the leadframe around the second mask layer to define a level of an embedded bottom surface of each of a plurality of contacts;
   forming a third mask where each of the plurality of contacts is to be located, the third mask extending between at least one of the contacts and the second die pad; and
   performing a third etch of the leadframe to separate each of the contacts from each other and from the first die pad and to separate each of the contacts except the at least one contact from the second die pad.

2. The method of claim 1 further comprising mounting a first die on the first die pad.

3. The method of claim 2 further comprising mounting a second die on the second die pad.

4. The method of claim 3 further comprising wire-bonding the first die to one of the contacts.

5. The method of claim 4 further comprising wire-bonding the second die to another one of the contacts.

6. The method of claim 4 further comprising encasing the first and second dice and the first and second die pads in a capsule, the bottom surface of the first die being exposed at a bottom surface of the capsule.

7. The method of claim 6 wherein a bottom surface of the second die remains covered by the capsule.

8. The method of claim 1 wherein forming the first mask layer defines where an exposed bottom surface of each of a plurality of contacts is to be located.

9. A method of fabricating a leadframe for a semiconductor package comprising;
   forming a first mask layer on a surface of the leadframe where a first die pad is to be located and where an exposed bottom surface of each of a plurality of contacts is to be located;
   performing a first partial etch of the leadframe to define a level of a bottom surface of a second die pad and an embedded bottom surface of each of a plurality of contacts;
   forming a second mask layer on the bottom surface of a second die pad and the embedded bottom surface of each of the plurality of contacts, the second mask layer extending between at least one of the contacts and the second die pad; and
   performing a second etch of the leadframe to separate each of the contacts from each other and from the first die pad and to separate each of the contacts except the at least one contact from the second die pad.

10. The method of claim 9 further comprising mounting a first die on the first die pad.

11. The method of claim 10 further comprising mounting a second die on the second die pad.

12. The method of claim 10 further comprising wire-bonding the first die to one of the contacts.

13. The method of claim 12 further comprising wire-bonding the second die to another one of the contacts.

14. The method of claim 13 further comprising encasing the first and second dice and the first and second die pads in a capsule, the bottom surface of the first die being exposed at a bottom surface of the capsule.

15. The method of claim 14 wherein a bottom surface of the second die remains covered by the capsule.

* * * * *

UNITED STATES PATENT AND TRADEMARK OFFICE
CERTIFICATE OF CORRECTION

PATENT NO. : 8,778,740 B2  
APPLICATION NO. : 13/897423  
DATED : July 15, 2014  
INVENTOR(S) : Richard Kent Williams et al.

Page 1 of 1

It is certified that error appears in the above-identified patent and that said Letters Patent is hereby corrected as shown below:

In the Specification:

At Column 2, line number 38, delete "lie" and insert --die--.

At Column 5, line number 56, delete "44" and insert --4A--.

At Column 6, line number 3, delete "79" and insert --7D--.

At Column 6, line number 14, delete "mist" and insert --must--.

Signed and Sealed this
Twenty-first Day of October, 2014

Michelle K. Lee
*Deputy Director of the United States Patent and Trademark Office*